(12) United States Patent
Sawada

(10) Patent No.: US 12,376,397 B2
(45) Date of Patent: Jul. 29, 2025

(54) IMAGE SENSING DEVICE

(71) Applicant: SK hynix Inc., Icheon-si (KR)

(72) Inventor: Ken Sawada, Tokyo (JP)

(73) Assignee: SK HYNIX INC., Icheon-si (KR)

( * ) Notice: Subject to any disclaimer, the term of this patent is extended or adjusted under 35 U.S.C. 154(b) by 491 days.

(21) Appl. No.: 17/726,859

(22) Filed: Apr. 22, 2022

(65) Prior Publication Data

US 2023/0026792 A1 Jan. 26, 2023

(30) Foreign Application Priority Data

Jul. 22, 2021 (KR) .......................... 10-2021-0096598

(51) Int. Cl.
*H10F 39/00* (2025.01)
*H01L 23/48* (2006.01)

(52) U.S. Cl.
CPC ..... *H10F 39/80373* (2025.01); *H01L 23/481* (2013.01); *H10F 39/809* (2025.01); *H10F 39/811* (2025.01)

(58) Field of Classification Search
CPC ............. H01L 27/14614; H01L 23/481; H01L 27/14634; H01L 27/14636; H01L 27/14609; H01L 27/14603; H04N 25/57
(Continued)

(56) References Cited

U.S. PATENT DOCUMENTS

| 10,367,031 B2 | 7/2019 | Walke et al. |
| 2011/0155893 A1* | 6/2011 | Endo ................ H01L 27/14632 257/292 |

(Continued)

FOREIGN PATENT DOCUMENTS

| CN | 103972258 A1 | 8/2014 |
| CN | 104979365 A1 | 10/2015 |

(Continued)

OTHER PUBLICATIONS

Coudrain, P. et al., "Towards a Three-Dimensional Back-Illuminated Miniaturized CMOS Pixel Technology using 100nm Inter-Layer Contacts." in Proc. of 2009, International Image Sensor Workshop, Bergen, Norway, Jun. 22-28, 2009.

(Continued)

*Primary Examiner* — Eva Y Montalvo
*Assistant Examiner* — Nicholas B Michaud
(74) *Attorney, Agent, or Firm* — Perkins Coie LLP

(57) ABSTRACT

An image sensing device includes a first substrate layer including a photoelectric conversion region for converting incident light into photocharges and a floating diffusion region for storing the photocharges therein, a first interconnect layer disposed over the first substrate layer and including a switch transistor gate overlapping at least a portion of the floating diffusion region, a second substrate layer disposed over the first interconnect layer, a second interconnect layer disposed over the second substrate layer, and a capacitor electrically coupled to the floating diffusion region by the switch transistor gate. The capacitor includes first and second electrodes that are disposed across the first interconnect layer, the second substrate layer, and the second interconnect layer, wherein a portion of the first interconnect layer, a portion of the second substrate layer, and a portion of the second interconnect layer are disposed between the first electrode and the second electrode.

15 Claims, 17 Drawing Sheets

(58) Field of Classification Search
USPC ........ 257/296, 301, 303, 306, 307, 308, 448
See application file for complete search history.

(56) References Cited

U.S. PATENT DOCUMENTS

| | | | |
|---|---|---|---|
| 2015/0076484 A1* | 3/2015 | Moriyama | H01L 21/265 |
| | | | 257/40 |
| 2016/0126282 A1* | 5/2016 | Chen | H01L 27/1463 |
| | | | 257/225 |
| 2018/0190699 A1 | 7/2018 | Lee et al. | |
| 2019/0043903 A1 | 2/2019 | Gambino et al. | |
| 2020/0411577 A1 | 12/2020 | Yamazaki et al. | |
| 2022/0084872 A1* | 3/2022 | Mizuta | H01L 27/14612 |
| 2022/0246653 A1* | 8/2022 | Tonegawa | H01L 28/90 |

FOREIGN PATENT DOCUMENTS

| | | |
|---|---|---|
| CN | 112054032 A1 | 12/2020 |
| CN | 113013186 A1 | 6/2021 |
| JP | WO2016080337 A1 | 4/2017 |
| JP | WO2017169882 A1 | 2/2019 |
| KR | 20120097401 A | 9/2012 |

OTHER PUBLICATIONS

First Office Action for CN Appl. No. 202210426980.6, mailed on Jun. 28, 2024, 11 pages with English translation.

Hirata T. et al., "A 1-inch 17Mpixel 1000fps Block-Controlled Coded-Exposure Back-Illuminated Stacked CMOS Image Sensor for Computational Imaging and Adaptive Dynamic Range Control," 2021 IEEE International Solid-State Circuits Conference (ISSCC), 3 pages.

* cited by examiner

IMAGE SENSING DEVICE

CROSS-REFERENCE TO RELATED APPLICATION

This patent document claims the priority and benefits of Korean patent application No. 10-2021-0096598, filed on Jul. 22, 2021, the disclosure of which is incorporated by reference in its entirety as part of the disclosure of this patent document.

TECHNICAL FIELD

The technology and implementations disclosed in this patent document generally relate to an image sensing device.

BACKGROUND

An image sensing device is a device for capturing optical images by converting light into electrical signals using a photosensitive semiconductor material which reacts to light. With the development of automotive, medical, computer and communication industries, the demand for high-performance image sensing devices is increasing in various fields such as smart phones, digital cameras, game machines, IoT (Internet of Things), robots, security cameras and medical micro cameras.

The image sensing device may be roughly divided into CCD (Charge Coupled Device) image sensing devices and CMOS (Complementary Metal Oxide Semiconductor) image sensing devices. The CCD image sensing devices offer a better image quality, but they tend to consume more power and are larger as compared to the CMOS image sensing devices. The CMOS image sensing devices are smaller in size and consume less power than the CCD image sensing devices. Furthermore, CMOS sensors are fabricated using the CMOS fabrication technology, and thus photosensitive elements and other signal processing circuitry can be integrated into a single chip, enabling the production of miniaturized image sensing devices at a lower cost. For these reasons, CMOS image sensing devices are being developed for many applications including mobile devices.

SUMMARY

Various embodiments of the disclosed technology relate to an image sensing device capable of guaranteeing a dynamic range while reducing a pixel size.

In one aspect, an image sensing device is provided to include a first substrate layer including a photoelectric conversion region for converting incident light into photocharges and a floating diffusion region for storing the photocharges therein, a first interconnect layer disposed over the first substrate layer, and configured to include a switch transistor gate formed to overlap at least a portion of the floating diffusion region, a second substrate layer disposed over the first interconnect layer, a second interconnect layer disposed over the second substrate layer, and a capacitor electrically coupled to the floating diffusion region by the switch transistor gate. The capacitor may include a first electrode and a second electrode that are disposed across the first interconnect layer, the second substrate layer, and the second interconnect layer, wherein a portion of the first interconnect layer, a portion of the second substrate layer, and a portion of the second interconnect layer are disposed between the first electrode and the second electrode.

In some implementations, the first electrode may include a plurality of first through silicon vias (TSVs) disposed across the first interconnect layer, the second substrate layer, and the second interconnect layer, and a connection electrode disposed in the second interconnect layer, and configured to interconnect the first through silicon vias (TSVs). In some implementations, the second electrode may include a plurality of second through silicon vias (TSVs) disposed across the first interconnect layer, the second substrate layer, and the second interconnect layer, and a ground contact portion disposed in the first interconnect layer, and disposed to interconnect the second through silicon vias (TSVs).

In some implementations, the ground contact portion may be coupled to a ground voltage. In some implementations, the connection electrode may be disposed perpendicular to the first through silicon vias (TSVs). In some implementations, the first substrate layer may include a contact region overlapping at least a portion of the switch transistor gate, wherein the first through silicon vias (TSVs) are in contact with the contact region. In some implementations, the contact region may be doped with higher-concentration impurities than the floating diffusion region.

In some implementations, the second interconnect layer may include a drive transistor gate overlapping at least a portion of the photoelectric conversion region, and the floating diffusion region may be coupled to a gate of the drive transistor by a through interconnect structure. The through interconnect structure may be disposed across the second interconnect layer, the second substrate layer, and the first interconnect layer. In some implementations, each of the through interconnect structure, the first electrode, and the second electrode may include at least one of copper (Cu) and tungsten (W). In some implementations, the first interconnect layer further includes a transfer transistor gate overlapping the photoelectric conversion region along a first side of the transfer transistor gate. In some implementations, the transfer transistor gate overlaps the floating diffusion region along a second side of the transfer transistor gate. In some implementations, a length of the first side is longer than a length of the second side.

In another aspect, an image sensing device is provided to include a first substrate layer configured to include a photoelectric conversion region for converting incident light into photocharges, and a floating diffusion region for storing the photocharges therein, a first interconnect layer disposed over the first substrate layer and including a transfer transistor gate overlapping at least a portion of the photoelectric conversion region and a switch transistor gate overlapping at least a portion of the floating diffusion region, a second substrate layer disposed over the first interconnect layer and including a first terminal region of a drive transistor and a second terminal region of the drive transistor, a second interconnect layer disposed over the second substrate layer and including a gate of a drive transistor that is coupled to the floating diffusion region by a through interconnect structure, and a capacitor disposed across the first interconnect layer, the second substrate layer, and the second interconnect layer. The capacitor may be electrically coupled to the floating diffusion region by the switch transistor gate.

In some implementations, the capacitor may include a first electrode and a second electrode. The first electrode may include a first through silicon via (TSV) disposed across the first interconnect layer, the second substrate layer, and the second interconnect layer, and a connection electrode disposed in the second interconnect layer. The second electrode may include a second through silicon via (TSV) disposed across the first interconnect layer, the second substrate layer, and the second interconnect layer, and a ground contact portion disposed in the first interconnect layer.

In some implementations, the capacitor may further include a dielectric region disposed between the first electrode and the second electrode, wherein the dielectric region includes a portion of the first interconnect layer, a portion of the second substrate layer, and a portion of the second interconnect layer. In some implementations, the ground contact portion may be coupled to a ground voltage. In some implementations, the first electrode may be electrically coupled to the floating diffusion region by the switch transistor gate.

In some implementations, the transfer transistor gate overlaps the floating diffusion region such that a length of a side of the transfer transistor gate overlapping with the photoelectric conversion region is longer than a length of another side of the transfer transistor gate overlapping with the floating diffusion region. In some implementations, the first substrate layer further includes a contact region doped with different impurities from those of the first substrate layer and overlapping at least a portion of the switch transistor gate.

It is to be understood that both the foregoing general description and the following detailed description of the disclosed technology are illustrative and explanatory and are intended to provide further explanation of the disclosure as claimed.

BRIEF DESCRIPTION OF THE DRAWINGS

The above and other features and beneficial aspects of the disclosed technology will become readily apparent with reference to the following detailed description when considered in conjunction with the accompanying drawings.

DETAILED DESCRIPTION

This patent document provides implementations and examples of an image sensing device capable of guaranteeing a dynamic range while reducing a pixel size. Some implementations of the disclosed technology relate to the image sensing device for guaranteeing a high dynamic range (HDR) while being miniaturized in size.

Hereafter, various embodiments will be described with reference to the accompanying drawings. However, it should be understood that the disclosed technology is not limited to specific embodiments, but includes various modifications, equivalents and/or alternatives of the embodiments. The embodiments of the disclosed technology may provide a variety of effects capable of being directly or indirectly recognized through the disclosed technology.

Figure 1:
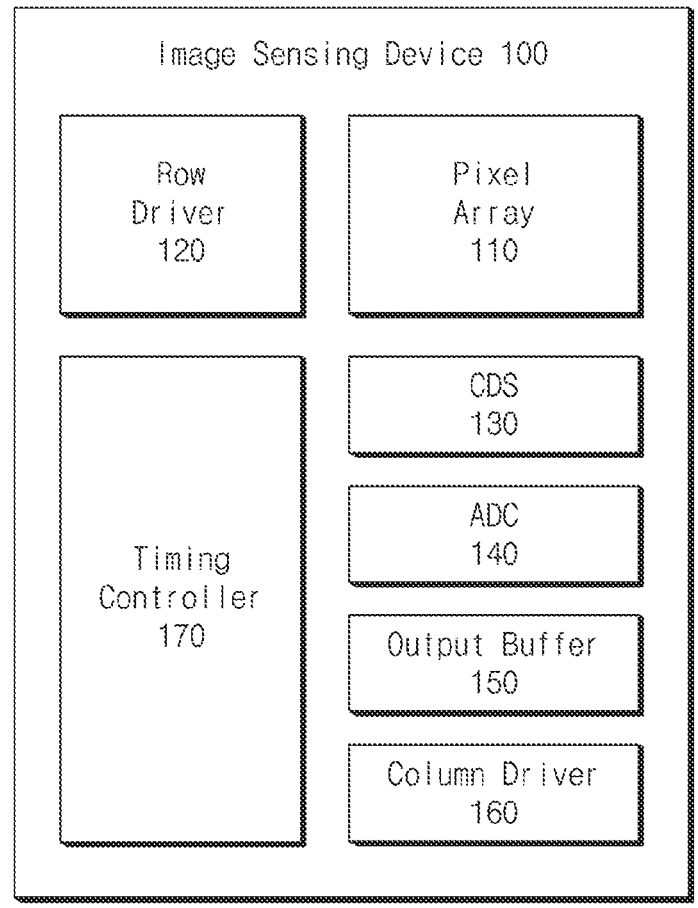
FIG. 1 is a block diagram illustrating an example of an image sensing device based on some implementations of the disclosed technology.

FIG. 1 is a block diagram illustrating an image sensing device 100 based on some implementations of the disclosed technology.

Referring to FIG. 1, the image sensing device 100 may include a pixel array 110, a row driver 120, a correlated double sampler (CDS) 130, an analog-digital converter (ADC) 140, an output buffer 150, a column driver 160, and a timing controller 170. The components of the image sensing device 100 illustrated in FIG. 1 are discussed by way of example only, and this patent document encompasses numerous other changes, substitutions, variations, alterations, and modifications.

The pixel array 110 may include a plurality of unit imaging pixels arranged in rows and columns. In one example, the plurality of unit imaging pixels can be arranged in a two dimensional pixel array including rows and columns. In another example, the plurality of unit imaging pixels can be arranged in a three dimensional pixel array. The plurality of unit pixels may convert an optical signal into an electrical signal on a unit pixel basis or a pixel group basis, where unit pixels in a pixel group share at least certain internal circuitry. The pixel array 110 may receive driving signals, including a row selection signal, a pixel reset signal and a transfer signal, from the row driver 120. Upon receiving the driving signal, corresponding imaging pixels in the pixel array 110 may be activated to perform the operations corresponding to the row selection signal, the pixel reset signal, and the transfer signal.

The row driver 120 may activate the pixel array 110 to perform certain operations on the imaging pixels in the corresponding row based on commands and control signals provided by controller circuitry such as the timing controller 170. In some implementations, the row driver 120 may select one or more imaging pixels arranged in one or more rows of the pixel array 110. The row driver 120 may generate a row selection signal to select one or more rows among the plurality of rows. The row decoder 120 may sequentially enable the pixel reset signal for resetting imaging pixels corresponding to at least one selected row, and the transfer signal for the pixels corresponding to the at least one selected row. Thus, a reference signal and an image signal, which are analog signals generated by each of the imaging pixels of the selected row, may be sequentially transferred to the CDS 130. The reference signal may be an electrical signal that is provided to the CDS 130 when a sensing node of an imaging pixel (e.g., a floating diffusion region node) is reset, and the image signal may be an electrical signal that is provided to the CDS 130 when photocharges generated by the imaging pixel are accumulated in the sensing node.

CMOS image sensors may use the correlated double sampling (CDS) to remove undesired offset values of pixels known as the fixed pattern noise by sampling a pixel signal twice to remove the difference between these two samples. In one example, the correlated double sampling (CDS) may remove the undesired offset value of pixels by comparing pixel output voltages obtained before and after photocharges generated by incident light are accumulated in the sensing node so that only pixel output voltages based on the incident light can be measured. In some embodiments of the disclosed technology, the CDS 130 may sequentially sample and hold voltage levels of the reference signal and the image signal, which are provided to each of a plurality of column lines from the pixel array 110. That is, the CDS 130 may sample and hold the voltage levels of the reference signal and the image signal which correspond to each of the columns of the pixel array 110.

In some implementations, the CDS 130 may transfer the reference signal and the image signal of each of the columns as a correlate double sampling signal to the ADC 140 based on control signals from the timing controller 170.

The ADC 140 is used to convert analog CDS signals into digital signals. In some implementations, the ADC 140 may be implemented as a ramp-compare type ADC. The ramp-compare type ADC may include a comparator circuit for comparing the analog pixel signal with a reference signal such as a ramp signal that ramps up or down, and a timer counts until a voltage of the ramp signal matches the analog pixel signal. In some embodiments of the disclosed technology, the ADC 140 may convert the correlate double sampling signal generated by the CDS 130 for each of the columns into a digital signal, and output the digital signal. The ADC 140 may perform a counting operation and a computing operation based on the correlate double sampling signal for each of the columns and a ramp signal provided from the timing controller 170. In this way, the ADC 140 may eliminate or reduce noises such as reset noise arising from the imaging pixels when generating digital image data.

The ADC 140 may include a plurality of column counters. Each column of the pixel array 110 is coupled to a column counter, and image data can be generated by converting the correlate double sampling signals received from each column into digital signals using the column counter. In another embodiment of the disclosed technology, the ADC 140 may include a global counter to convert the correlate double sampling signals corresponding to the columns into digital signals using a global code provided from the global counter.

The output buffer 150 may temporarily hold the column-based image data provided from the ADC 140 to output the image data. In one example, the image data provided to the output buffer 150 from the ADC 140 may be temporarily stored in the output buffer 150 based on control signals of the timing controller 170. The output buffer 150 may provide an interface to compensate for data rate differences or transfer rate differences between the image sensing device 100 and other devices.

The column driver 160 may select a column of the output buffer upon receiving a control signal from the timing controller 170, and sequentially output the image data, which are temporarily stored in the selected column of the output buffer 150. In some implementations, upon receiving an address signal from the timing controller 170, the column driver 160 may generate a column selection signal based on the address signal and select a column of the output buffer 150, outputting the image data as an output signal from the selected column of the output buffer 150.

The timing controller 170 may control operations of the row driver 120, the ADC 140, the output buffer 150 and the column driver 160.

The timing controller 170 may provide the row driver 120, the column driver 160 and the output buffer 150 with a clock signal required for the operations of the respective components of the image sensing device 100, a control signal for timing control, and address signals for selecting a row or column. In an embodiment of the disclosed technology, the timing controller 170 may include a logic control circuit, a phase lock loop (PLL) circuit, a timing control circuit, a communication interface circuit and others.

Figure 2:
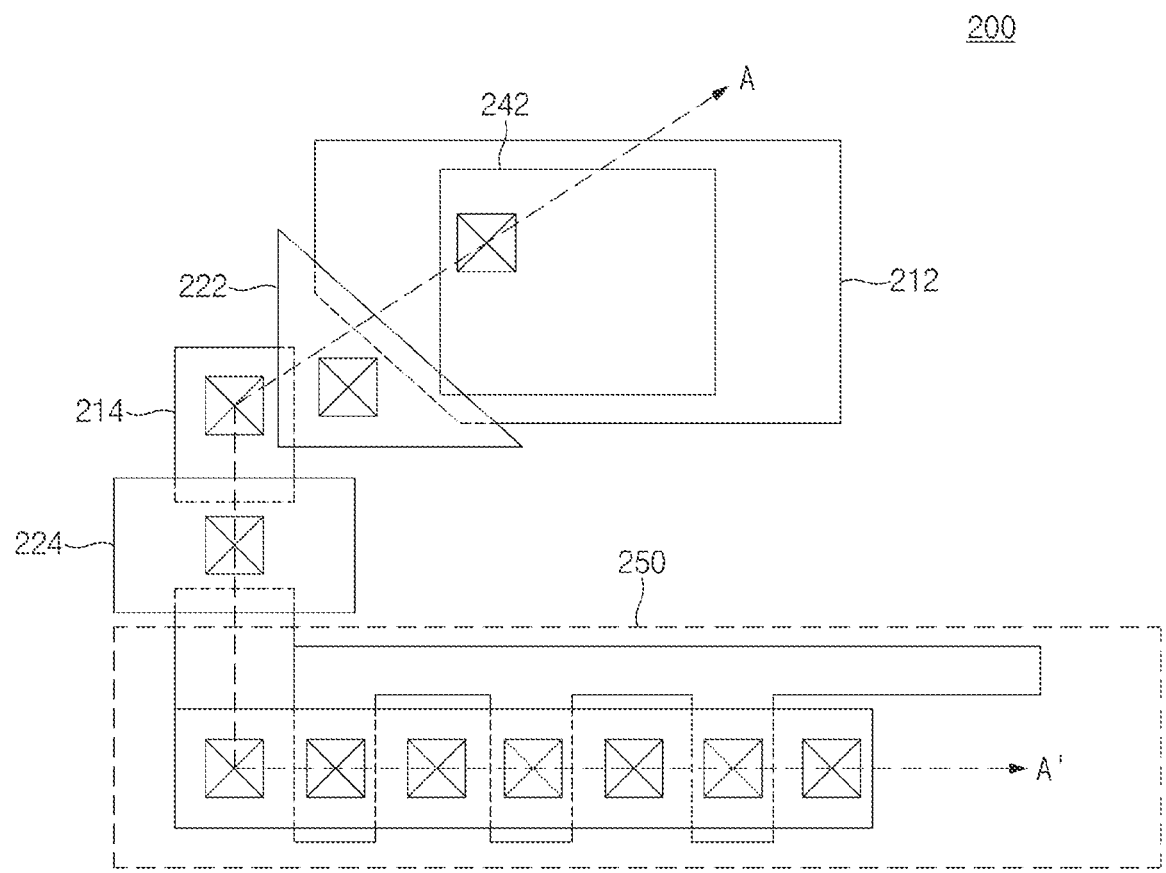
FIG. 2 is an example of a schematic diagram illustrating an example of a layout structure of any one unit pixel included in a pixel array shown in FIG. 1 based on some implementations of the disclosed technology.

FIG. 2 is a schematic diagram illustrating an example of a layout structure 200 of any one unit pixel included in the pixel array 110 shown in FIG. 1 based on some implementations of the disclosed technology.

In some implementations, the unit pixel may include a photoelectric conversion region 212, a floating diffusion (FD) region 214, a transfer transistor gate 222, a switch transistor gate 224, a drive transistor gate 242, and a capacitor 250.

The structure shown in FIG. 2 is merely an example, and the relative sizes and positions of the respective constituent elements (e.g., 212, 214, 222, 224, 242, 250, etc.) can be varied in some implementations.

Each of the photoelectric conversion regions 212 may generate photocharges corresponding to incident light. Each of the photoelectric conversion regions 212 may include an organic or inorganic photodiode.

For example, the photoelectric conversion regions 212 may be formed in a substrate layer, and may be formed in a stacked structure in which impurity regions (P-type and N-type impurity regions) having complementary conductivities are vertically stacked.

The photoelectric conversion region 212 may be arranged to occupy region as large as possible to easily generate photocharges corresponding to incident light. A region where the photoelectric conversion region 212 and the transfer transistor gate 222 overlap each other may extend along the side of the transfer transistor gate 222.

The photoelectric conversion region 212 may be electrically coupled to or separated from the floating diffusion (FD) region 214 in response to the voltage applied to the transfer transistor gate 222.

The transfer transistor gate 222 may be disposed between the floating diffusion (FD) region 214 and the photoelectric conversion region 212. The transfer transistor gate 222 may be disposed to overlap with at least a portion of the photoelectric conversion region 212 and at least a portion of the floating diffusion (FD) region 214.

In some implementations, the transfer transistor gate 222 may be formed in a triangular shape having sides overlapping the photoelectric conversion region 212 and floating diffusion (FD) region 214. The length of the side of the transfer transistor gate 222 overlapping the photoelectric conversion region 212 may be longer that of the side overlapping the floating diffusion (FD) region 214.

One side of the transfer transistor gate 222 overlapping the photoelectric conversion region 212 may extend along the photoelectric conversion region 212, and one side of the transfer transistor gate 222 overlapping the floating diffusion (FD) region 214 may extend along the floating diffusion (FD) region 214. The transfer transistor gate 222 may be formed of or include metal or polysilicon.

The floating diffusion (FD) region 214 may temporarily store photocharges generated by the photoelectric conversion region 212. The image sensing device 100 may generate a pixel signal based on a voltage signal corresponding to photocharges stored in the floating diffusion (FD) region 214.

The floating diffusion (FD) region 214 may be disposed between the transfer transistor gate 222 and the switch transistor gate 224. The floating diffusion (FD) region 214 may be formed in a square shape, and other implementations are also possible. For example, when the plurality of unit pixels constructs the shared pixel, the floating diffusion (FD) region 214 may be formed in a polygonal shape such as a diamond or octagonal shape. In some implementations, the floating diffusion (FD) region 214 may be an N-type impurity doped region formed over the semiconductor substrate.

The floating diffusion (FD) region 214 may be coupled to a first electrode of the capacitor 250 through the switch transistor gate 224 disposed to overlap the floating diffusion (FD) region 214.

The switch transistor gate 224 may be disposed to overlap at least a portion of the floating diffusion (FD) region 214 and at least a portion of the capacitor 250. The floating diffusion (FD) region 214 may be coupled to or separated from the capacitor 250 in response to a switch signal applied to the switch transistor gate 224.

For example, the switch transistor gate 224 may be formed in a rectangular shape. The long sides from among a plurality of sides of the switch transistor gate 224 may be disposed to overlap the floating diffusion (FD) region 214 and the capacitor 250, such that electrons can easily move between the floating diffusion (FD) region 214 and the capacitor 250.

The capacitor 250 may be formed over a plurality of substrate layers and a plurality of interconnect layers, and may include a first electrode, a second electrode, and a dielectric region. In addition, at least a portion of a contact region included in the capacitor 250 may overlap the switch transistor gate 224.

The capacitor 250 may store overflown charges, the amount of which exceeds capacitance of the floating diffusion (FD) region 214, and may be coupled to the floating diffusion (FD) region 214, so that the capacitor 250 can provide additional capacitance to the floating diffusion (FD) region 214.

The capacitor 250 may be arranged to have a vertical structure in a manner that the region occupied by the unit pixel layout structure 200 can be miniaturized and sufficient capacitance can be guaranteed. For example, the capacitor may be a lateral overflow integration capacitor.

In some implementations, the capacitor 250 may include a first electrode and a second electrode, each of which includes a plurality of vertical through interconnects (also called vertical through wires). The vertical through interconnects may be coupled to a doped region included in the substrate, or may be coupled to a connection electrode formed over the interconnect layer or a ground contact portion formed over the interconnect layer. The capacitor 250 may be formed to have predetermined capacity, and may have, for example, a metal insulation metal (MIM) structure.

The drive transistor gate 242 may be disposed to overlap the photoelectric conversion region 212. The drive transistor gate 242 is formed to overlap the photoelectric conversion region 212, so that a sufficient-sized gate region can be guaranteed.

The drive transistor gate 242 may be coupled to the floating diffusion (FD) region 214, and may amplify a signal corresponding to the voltage of the floating diffusion (FD) region 214.

In the example, the drive transistor gate 242 overlaps the photoelectric conversion region 212. Other implementations are also possible such that the drive transistor gate 242, a reset transistor gate (not shown), a select transistor gate (not shown), or others may be disposed to overlap the photoelectric conversion region 212.

Figure 3A:
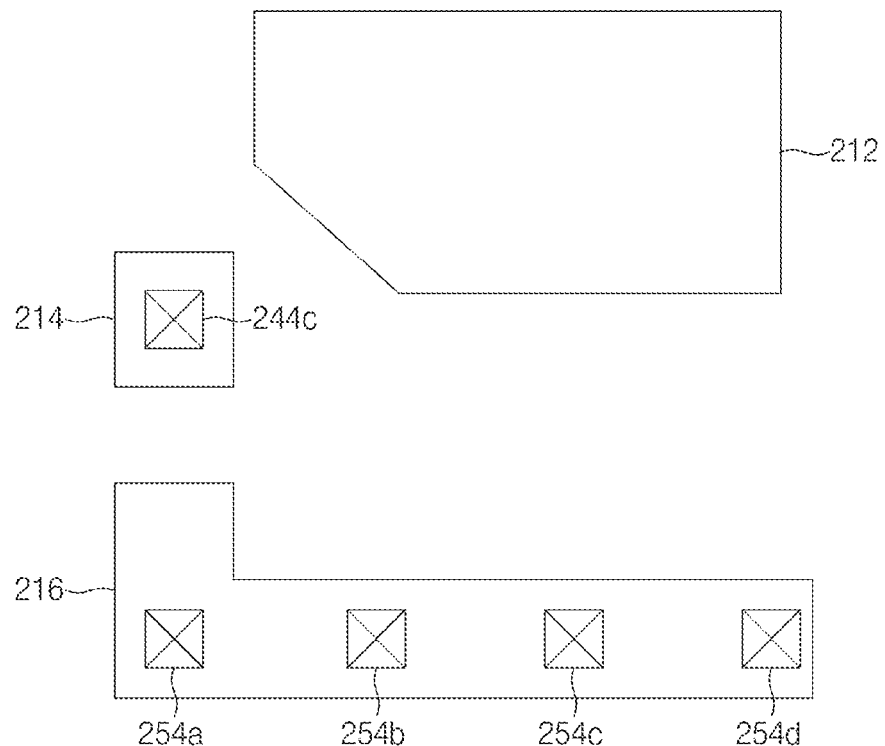
FIGS. 3A to 3C are schematic diagrams illustrating examples of some constituent elements formed over a same substrate layer or a same interconnect layer (also called an interconnect layer or a wiring layer) among constituent elements included in a unit pixel based on some implementations of the disclosed technology.
Figure 3B:
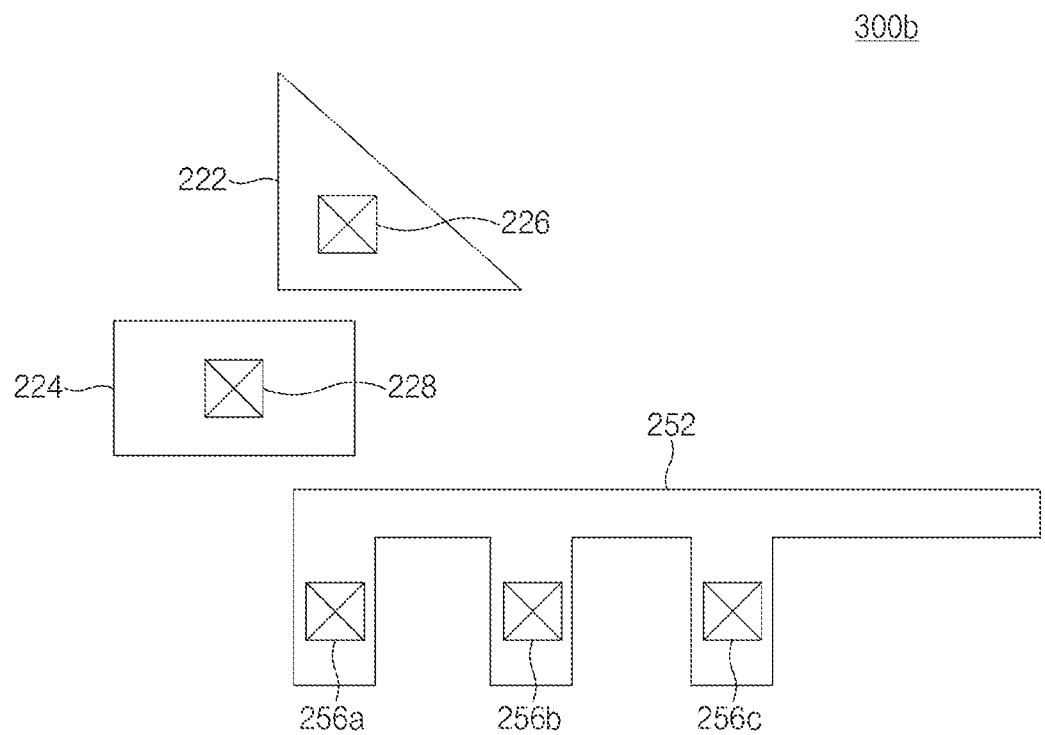
Figure 3C:
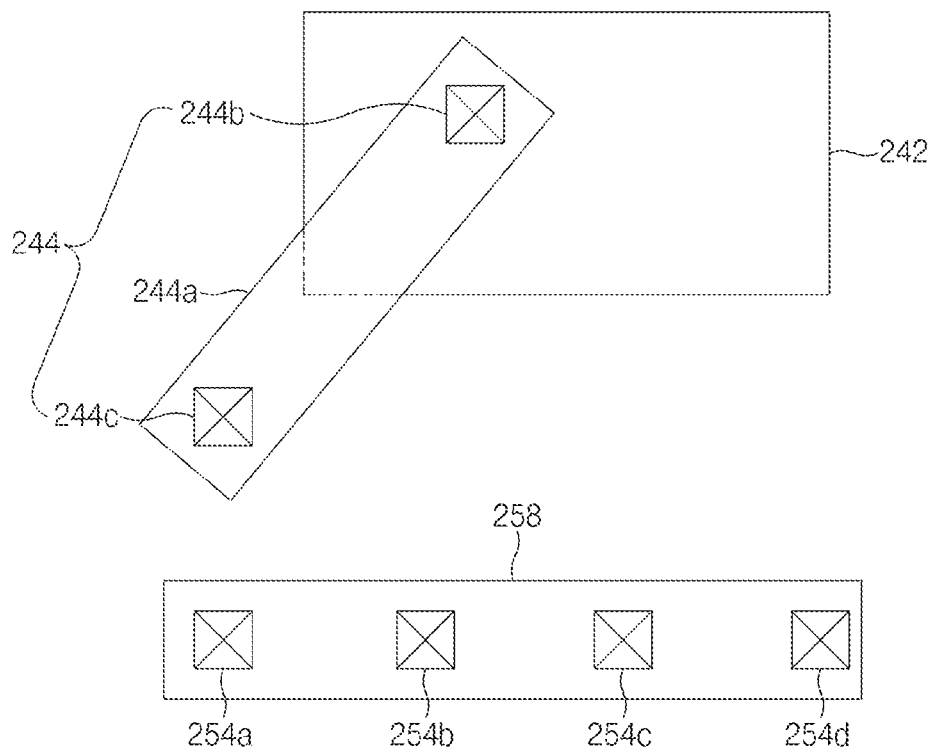

FIGS. 3A to 3C are schematic diagrams illustrating examples of some constituent elements formed over either the same substrate layer or the same interconnect layer from among constituent elements included in the unit pixel based on some implementations of the disclosed technology.

FIG. 3A is a schematic diagram (300a) illustrating an example of constituent structures formed over a first substrate layer from among the plurality of constituent elements included in the unit pixel based on some implementations of the disclosed technology.

The first substrate layer may be a semiconductor substrate doped with impurities. For example, the first substrate layer may be a semiconductor substrate doped with P-type impurities.

The first substrate layer may include a photoelectric conversion region 212, a floating diffusion (FD) region 214, and a contact region 216.

The photoelectric conversion region 212 may include an organic or inorganic photodiode formed over the substrate layer. In addition, the photoelectric conversion region 212 may be formed to have a stacked structure of P-type doped regions doped with P-type impurities and/or N-type doped regions doped with N-type impurities. As described above, the photoelectric conversion region 212 may be disposed to occupy as large a region as possible from among the active region of the unit pixel.

The floating diffusion (FD) region 214 may be formed by doping N-type impurities over the first substrate layer.

The contact region 216 may be formed by doping N-type impurities over the first substrate layer. The contact region 216 may be coupled to first through silicon vias (TSVs) 254a, 254b, 254c and 254d of the capacitor 250.

In some implementations, the contact region 216 may be formed to have a higher doping concentration than the floating diffusion (FD) region 214. The first TSVs 254a, 254b, 254c and 254d are coupled to the contact region 216 doped with high-concentration impurities (e.g., N-type impurities), resulting in reduction in resistance between the first electrode and the contact region 216.

The first TSVs 254a, 254b, 254c and 254d may be included in the first electrode of the capacitor 250. The first TSVs 254a, 254b, 254c and 254d may be formed of or include metal, for example, copper (Cu) or tungsten (W) or combination of copper (Cu) and tungsten (W). The first TSVs 254a, 254b, 254c and 254d may be formed perpendicular to one surface of the contact region 216, and may be formed across a first interconnect layer, a second substrate layer, and a second interconnect layer to be described later.

In addition, the contact region 216 may operate as one terminal of the switch transistor including the switch transistor gate 224. When the contact region 216 operates as one terminal of the switch transistor, the first electrode of the capacitor 250 may be coupled to the switch transistor without a separate connection conductive line.

FIG. 3B is a schematic diagram (300b) illustrating an example of constituent structures formed over the first interconnect layer from among the plurality of constituent elements included in the unit pixel based on some implementations of the disclosed technology. The first interconnect layer may be formed or disposed over the first substrate layer. The first interconnect layer may include an insulation material such as silicon oxide.

The first interconnect layer may include a transfer transistor gate 222, a switch transistor gate 224, and a ground contact portion 252.

The transfer transistor gate 222 may be coupled to a transmission signal line 226. A transmission signal may be applied to the transfer transistor gate 222 through the transmission signal line 226. In some implementations, the transfer transistor gate 222 may be formed of or include polysilicon, and the transmission signal line 226 may be formed of or include metal.

The switch transistor gate 224 may be coupled to a switch signal line 228. The switch signal may be applied to the switch transistor gate 224 through the switch signal line 228. In some implementations, the switch transistor gate 224 may be formed of or include polysilicon, and the switch signal line 228 may be formed of or include metal.

The ground contact portion 252 may be formed of or include metal, and may be included in a second electrode of the capacitor 250. The ground contact portion 252 may be grounded (GND). The second electrode of the capacitor 250 may refer to an electrode that is not in contact with the contact region 216.

In some implementations, the second electrode of the capacitor 250 may include the ground contact portion 252 and the second TSVs 256a, 256b, and 256c. Each of the second TSVs 256a, 256b, and 256c may be formed of or include metal, for example, copper (Cu) or tungsten (W) or combination of copper (Cu) and tungsten (W). Although the second TSVs 256a, 256b, and 256c can be formed across the first interconnect layer, the second substrate layer, and the second interconnect layer, the second TSVs 256a, 256b, and 256c may be different in length from the first TSVs 254a, 254b, 254c and 254d.

FIG. 3C is a schematic diagram (300c) illustrating an example of constituent structures formed over the second interconnect layer from among the plurality of constituent elements included in the unit pixel based on some implementations of the disclosed technology. The second interconnect layer may be formed over the first interconnect layer.

The second interconnect layer may be disposed over a second substrate layer distinguished from the first substrate layer. In some implementations, the second interconnect layer may refer to a layer formed to include an insulation material such as silicon oxide.

The second interconnect layer may include a drive transistor gate 242, a through interconnect (also called a through wiring) 244, and a connection electrode 258.

In some implementations, the drive transistor gate 242 may be coupled to the floating diffusion (FD) region 214 through the through interconnect 244.

The through interconnect 244 may include a first through portion 244b contacting the drive transistor gate 242, a second through portion 244c contacting the floating diffusion (FD) region 214, and a connection portion 244a for connecting the first through portion 244b to the second through portion 244c. The shape of the connection portion 244a included in the through interconnect 244 may be changeable depending on the interconnect layout structures.

The through interconnect 244 may be formed of or include metal. In some implementations, the metal may include copper (Cu) or tungsten (W) or combination of copper (Cu) and tungsten (W).

The connection electrode 258 may be included in the first electrode of the capacitor 250. In some implementations, the connection electrode 258 may be coupled to four first TSVs 254a, 254b, 254c and 254d.

Since the connection electrode 258 is coupled to the first TSVs 254a, 254b, 254c and 254d to form a first electrode, the capacitor 250 may guarantee additional capacitance generated between the connection electrode 258 and the second TSVs 256a, 256b, and 256c.

Figure 4:
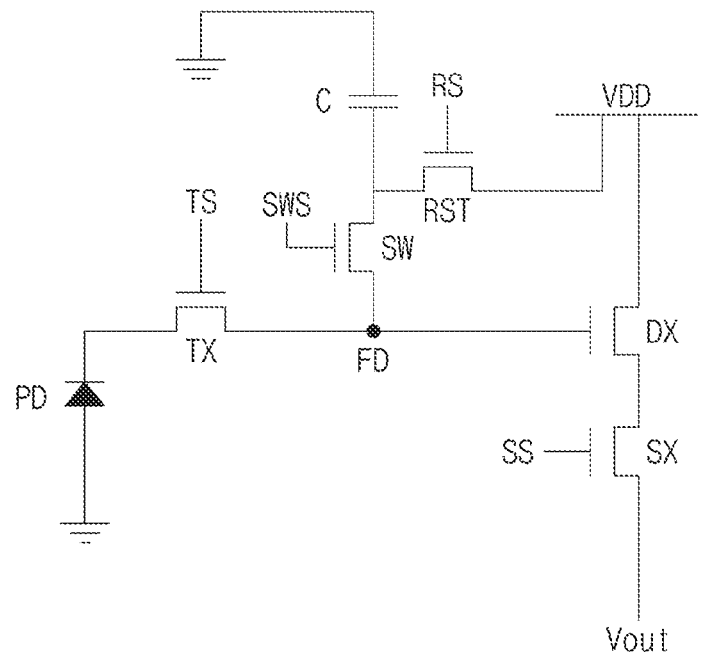
FIG. 4 is a circuit diagram illustrating an example of a unit pixel based on some implementations of the disclosed technology.

FIG. 4 is a circuit diagram (400) illustrating an example of the unit pixel based on some implementations of the disclosed technology.

As can be seen from FIG. 4, the connection relationship among a photoelectric conversion region (PD), a transfer transistor (TX), a floating diffusion (FD) region, a switch transistor (SW), a capacitor (C), a reset transistor (RST), a drive transistor (DX), and a select transistor (SX), which are included in each unit pixel (PX), are illustrated.

The photoelectric conversion region (PD) shown in FIG. 4 may correspond to the photoelectric conversion region (e.g., 212 of FIG. 2) illustrated in FIGS. 2 and 3A.

The photoelectric conversion region (PD) may be coupled to the floating diffusion (FD) region through the transfer transistor (TX).

The transfer transistor (TX) may include the transfer transistor gate (e.g., 222 of FIG. 2) shown in FIGS. 2 and 3B. The floating diffusion (FD) region shown in FIG. 4 may correspond to the floating diffusion region (e.g., 214 of FIG. 2) shown in FIGS. 2 and 3A.

The photoelectric conversion region (PD) may generate photocharges corresponding to incident light during an integration time where photocharges are accumulated. In this case, the time where photocharges corresponding to incident light are generated by the photoelectric conversion region (PD) may be referred to as an integration time.

When a transmission signal (TS) having an activation voltage level is applied to the transfer transistor (TX), photocharges generated by the photoelectric conversion region (PD) may be applied to the floating diffusion (FD) region.

The transmission signal (TS) may have an activation voltage level or an inactivation voltage level. The transfer transistor (TX) may control movement of photocharges in response to a voltage level of the transmission signal (TS).

When the transmission signal (TS) having an activation voltage level is applied to the transfer transistor (TX), photocharges generated by the photoelectric conversion region (PD) can be accumulated in the floating diffusion (FD) region.

The floating diffusion (FD) region may be coupled to a gate (e.g., 242 of FIGS. 2 and 3C) of the drive transistor (DX). A voltage signal corresponding to photocharges accumulated in the floating diffusion (FD) region may be amplified by the drive transistor (DX).

A drain region of the drive transistor (DX) may be coupled to the select transistor (SX). The select transistor (SX) may selectively output the signal amplified by the drive transistor (DX) in response to a select control signal (SS). A signal output from the select transistor (SX) may be referred to as a pixel signal (Vout).

The floating diffusion (FD) region may be coupled to one terminal of the reset transistor (RST) and the first electrode of the capacitor (C) through the switch transistor (SW).

The switch transistor (SW) may include the switch transistor gate (e.g., 224 of FIG. 2) shown in FIGS. 2 and 3B. The capacitor C shown in FIG. 4 may correspond to the capacitor 250 shown in FIG. 2.

The first electrode of the capacitor C may be coupled to one terminal of the switch transistor SW and one terminal of the reset transistor RST, and the second electrode may be grounded.

In a high-illuminance environment, when photocharges exceeding capacitance of the photoelectric conversion region (PD) are generated, the generated photocharges may overflow into the floating diffusion (FD) region and the capacitor C. In this case, the term "overflow" means that photocharges move beyond potential barriers of the transfer transistor (TX) and the switch transistor (SW) to which an activation voltage is not applied.

When the capacitor C does not exist in the unit pixel shown in FIG. 4, leakage current may occur due to leaked overflown photocharges. The generated leakage current may allow noise to occur in the pixel signal, so that the pixel signal may be distorted.

On the other hand, when the capacitor C exists in the unit pixel shown in FIG. 4, overflown photocharges may be temporarily stored in the capacitor C, saturation of the floating diffusion (FD) region can be prevented, and leakage current can also be prevented from occurring.

In some implementations, the floating diffusion (FD) region may be coupled to or separated from the capacitor C in response to a switch signal (SWS) applied to the switch transistor (SW).

When the floating diffusion (FD) region is coupled to the capacitor C, total capacitance of the floating diffusion (FD) region may increase. A conversion gain of the floating diffusion (FD) region may be inversely proportional to capacitance of the floating diffusion (FD) region. Accordingly, in comparison between a first case where the capacitor C is coupled to the floating diffusion (FD) region with a second case where the capacitor C is not coupled to the floating diffusion (FD) region on the assumption that the same amount of photocharges is accumulated in the first case and the second case, a smaller pixel signal may be output in the first case as compared to the second case. In other words, the capacitor C and the switch transistor SW may adjust the conversion gain of the unit pixel.

In some implementations, the capacitor C may have higher capacitance than the floating diffusion (FD) region. Since the capacitor C has higher capacitance than the floating diffusion (FD) region, the capacitor C may easily store overflown photocharges received from the floating diffusion (FD) region, so that a change in conversion gain of the floating diffusion (FD) region may greatly increase.

The reset transistor (RST) may reset constituent elements (e.g., a floating diffusion (FD) region, a photoelectric conversion region (PD), etc.) included in the unit pixel to a predetermined potential level (e.g., a pixel voltage VDD). The signal applied to the reset transistor (RST) may be referred to as a reset signal (RS). When the reset signal (RS) has an activation voltage level, each of the transmission signal (TS) and the switch signal (SWS) may have an activation voltage level.

Figure 5:
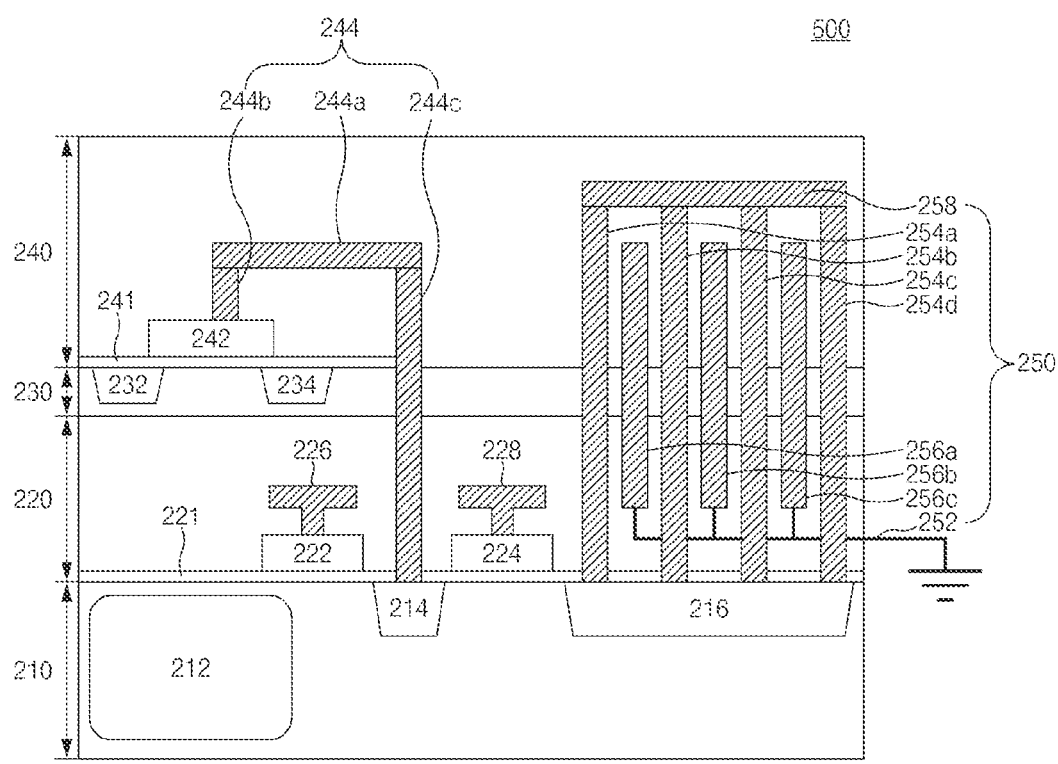
FIG. 5 is a cross-sectional view illustrating an example of some regions of a unit pixel taken along a first cutting line shown in FIG. 2 based on some implementations of the disclosed technology.

FIG. 5 is a cross-sectional view (500) illustrating an example of some regions of the unit pixel taken along the first cutting line A-A' shown in FIG. 2 based on some implementations of the disclosed technology.

In some implementations, the unit pixel may be formed across the plurality of substrate layers and interconnect layers. For example, the unit pixel may be formed across the first substrate layer 210, the first interconnect layer 220, the second substrate layer 230, and the second interconnect layer 240.

The first substrate layer 210 may include a photoelectric conversion region 212, a floating diffusion region 214, and a contact region 216. In some implementations, the first substrate layer 210 may be a silicon substrate doped with N-type or P-type impurities. In some other implementations, the first substrate layer 210 may include an epitaxial layer formed over the silicon substrate.

The photoelectric conversion region 212 may include an impurity-doped region formed over the first substrate layer 210.

The floating diffusion region 214 may include a region that is doped with conductive impurities different from those of the first substrate layer 210. For example, the floating diffusion region 214 formed over the silicon substrate doped with P-type impurities may include an N-type doped region doped with N-type impurities.

The first substrate layer 210 may include the contact region 216. The contact region 216 may be doped with impurities different from those of the first substrate layer 210. For example, when the first substrate layer 210 is doped with P-type impurities, the contact region 216 may be doped with N-type impurities. In some implementations, the contact region 216 may be doped with higher-concentration impurities than the floating diffusion region 214.

As the contact region 216 is doped with high-concentration impurities, resistance between the contact region 216 and each of the first TSVs 254a, 254b, 254c and 254d may decrease.

The first interconnect layer 220 may be formed over the first substrate layer 210. For example, the first interconnect layer 220 may include silicon oxide.

In some implementations, the first interconnect layer 220 may include a first dielectric layer 221. The first dielectric layer 221 may be formed or disposed between the first interconnect layer 220 and the first substrate layer 210. At least a portion of the first dielectric layer 221 may be used as an insulation layer for the transfer transistor gate 222 and the switch transistor gate 224.

The first interconnect layer 220 may include the transfer transistor gate 222, the switch transistor gate 224, the transmission signal line 226, a switch signal line 228, and a portion of the capacitor 250.

In some implementations, the transfer transistor gate 222 and the switch transistor gate 224 may be formed of or include polysilicon. In addition, the transmission signal line 226 and the switch signal line 228 may be formed of or include metal such as copper (Cu) or tungsten (W) or combination of copper (Cu) and tungsten (W).

A metal line (or a metal wire) formed in the first interconnect layer may include a ground contact portion 252 connected to the second electrode of the capacitor 250. The ground contact portion 252 may be connected to a ground voltage (GND).

The ground contact portion 252 may be used to explain the fact that the ground contact portion 252 is connected to the second TSVs 256a, 256b, and 256c. As can be seen from the cross-sectional view of the unit pixel taken along the first cutting line A-A', the ground contact portion 252 may be covered by the first interconnect layer 220 and the second TSVs 256a, 256b, and 256c. In addition, in the device, the ground contact portion 252 may be coupled to the second TSVs 256a, 256b, and 256c without contacting the first TSVs 254a, 254b, 254c and 254d.

The transfer transistor gate 222 may be included in the transfer transistor (TX) shown in FIG. 4, and the switch transistor gate 224 may also be included in the switch transistor (SW) shown in FIG. 4.

The second substrate layer 230 may be a silicon-on-insulator (SOI) substrate formed over the first interconnect layer 220.

The second substrate layer 230 may include a first terminal region 232 of a drive transistor (e.g., DX of FIG. 4), a second terminal region 234 of the drive transistor, and a portion of the capacitor 250. The first terminal region 232 of the drive transistor may be coupled to a pixel voltage, and the second terminal region 234 of the drive transistor may be coupled to the select transistor (e.g., SX of FIG. 4).

The second interconnect layer 240 may be formed over the second substrate layer 230. A second dielectric layer 241 may be formed between the second interconnect layer 240 and the second substrate layer 230. In some implementations, the second dielectric layer 241 may be formed only in a partial region disposed between the second interconnect layer 240 and the second substrate layer 230. The partial region may be a region in which the drive transistor DX is formed or disposed.

The drive transistor gate 242 may include polysilicon. The drive transistor gate 242 may be coupled to the floating diffusion region 214 by the through interconnect 244.

The through interconnect 244 may include a first through portion 244b formed to contact the drive transistor gate 242, a second through portion 244c formed to contact the floating diffusion region 214, and a connection portion 244a for connecting the first through portion 244b to the second through portion 244c.

In some implementations, the capacitor 250 may be formed across the first interconnect layer 220, the second substrate layer 230, and the second interconnect layer 240. The capacitor 250 may be formed to have a metal insulator metal (MIM) structure that includes a plurality of TSVs 254a, 254b, 254c, 254d, 256a, 256b, and 256c and dielectric regions (e.g., a first dielectric layer 221, a first interconnect layer 220, a second substrate layer 230, and a second interconnect layer 240) disposed between the above-mentioned TSVs 254a, 254b, 254c, 254d, 256a, 256b, and 256c.

Although not shown in the drawings, an insulation layer may be formed or disposed between each of the TSVs 254a, 254b, 254c, 254d, 256a, 256b, and 256c and each of the dielectric regions 221, 220, 230, and 240. The TSVs 254a, 254b, 254c, 254d, 256a, 256b, and 256c may be formed perpendicular to one surface of the first substrate layer 210. In some implementations, the TSVs (254a, 254b, 254c, 254d, 256a, 256b, 256c) may be formed or disposed in a region where the stacked substrate layers (e.g., 210 and 230), the interconnect layers (e.g., 220 and 240), and the first dielectric layer 221 are etched.

The first TSVs 254a, 254b, 254c, and 254d may be directly coupled to the contact region 216 included in the first substrate layer 210. In addition, the first TSVs 254a, 254b, 254c, and 254d may be interconnected by the connection electrode 258 formed in the second interconnect layer 240. The first TSVs 254a, 254b, 254c, and 254d and the connection electrode 258 may form the first electrode of the capacitor 250.

The second TSVs 256a, 256b, and 256c may be interconnected by the ground contact portion 252 formed in the first interconnect layer 220. The second TSVs 256a, 256b, and 256c may form the second electrode of the capacitor 250, and the formed second electrode may be grounded.

As can be seen from FIG. 5, the first TSVs 254a, 254b, 254c, and 254d and the second TSVs 256a, 256b, and 256c of the capacitor 250 may be formed in an alternating structure.

Each of the second TSVs 256a, 256b, and 256c may be shorter in vertical length than each of the first TSVs 254a, 254b, 254c, and 254d. Accordingly, a portion of the first interconnect layer 220 and a portion of the second interconnect layer 240 may be disposed between the second TSVs (256a, 256b, 256c) and the first TSVs (254a, 254b, 254c, 254d). A portion of the first interconnect layer 220 and a portion of the second interconnect layer 240 may be used as dielectric regions of the capacitor 250.

The capacitor 250 may be coupled to the switch transistor SW through the contact region 216. In some implementations, the contact region 216 may operate as one terminal of the switch transistor SW.

FIGS. 6A to 6J are cross-sectional views illustrating examples of a method for forming the unit pixel based on some implementations of the disclosed technology.

FIGS. 6A to 6J are shown for illustrative purposes, and thus other implementations are also possible. For example, the positions and sizes of constituent elements for use in devices may be different from those of FIGS. 6A to 6J.

Figure 6A:
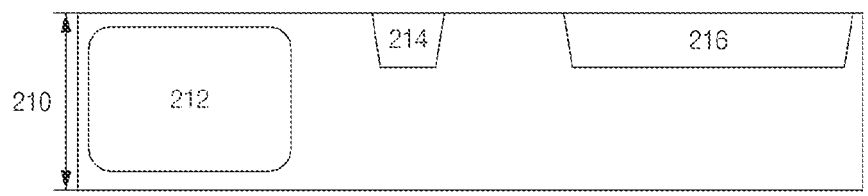
FIGS. 6A to 6J are cross-sectional views illustrating examples of a method for forming the unit pixel based on some implementations of the disclosed technology.

Referring to FIG. 6A, a first substrate layer 210 may include the photoelectric conversion region 212, the floating diffusion region 214, and the contact region 216.

The photoelectric conversion region 212, the floating diffusion region 214, and the contact region 216 may be formed by doping impurities over the first substrate layer 210.

In some implementations, the photoelectric conversion region 212 may have a stacked structure doped with N-type and P-type impurities. In addition, each of the floating diffusion region 214 and the contact region 216 may be doped with N-type impurities.

Figure 6B:
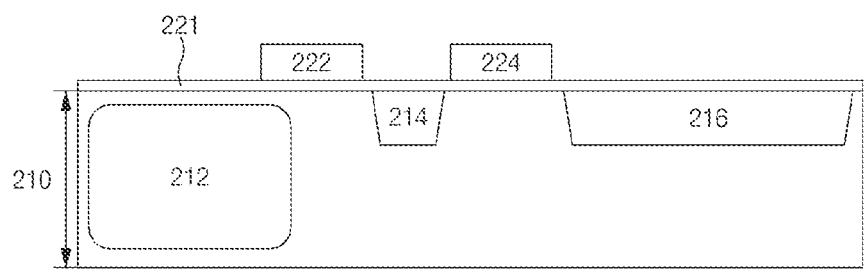

As can be seen from the cross-sectional view of FIG. 6B, the first dielectric layer 221 may be formed or disposed over the first substrate layer 210, the transfer transistor gate 222 and the switch transistor gate 224 may be formed or disposed over the first dielectric layer 221.

The first dielectric layer 221 may include, for example, silicon oxide. Each of the transfer transistor gate 222 and the switch transistor gate 224 may be formed of or include polysilicon. Each of the transfer transistor gate 222 and the switch transistor gate 224 may be formed through a silicon deposition process.

Figure 6C:
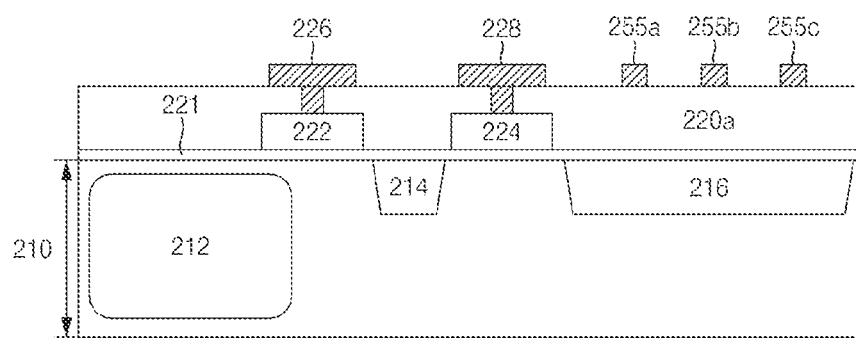

As can be seen from the cross-sectional view of FIG. 6C, a portion 220a of the first interconnect layer, the transmission signal line 226, the switch signal line 228, and the second TSV patterns 255a, 255b, and 255c may be formed over the first dielectric layer 221.

A portion 220a of the first interconnect layer may include a low-permittivity material such as silicon oxide.

The transmission signal line 226, the switch signal line 228, and the second TSV patterns 255a, 255b, and 255c may be formed by etching the portion 220a of the first interconnect layer.

The second TSV patterns 255a, 255b, and 255c may indicate positions where the second TSVs will be formed. In addition, the transmission signal line 226, the switch signal line 228, and the second TSV patterns 255a, 255b, and 255c may be formed of or include the same metal, for example, copper (Cu) or tungsten (W) or combination of copper (Cu) and tungsten (W).

Figure 6D:
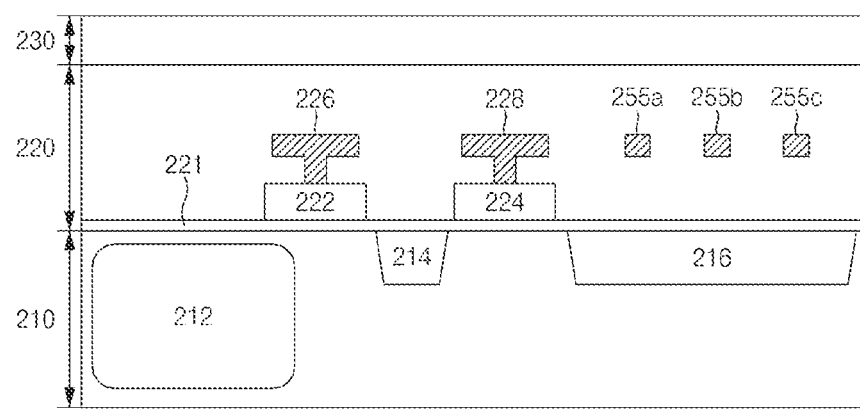

As can be seen from the cross-sectional view of FIG. 6D, the first interconnect layer 220 may be formed, and the second substrate layer 230 may be formed over the first interconnect layer 220. In some implementations, the second substrate layer 230 may be formed of or include polysilicon doped with P-type impurities. The second substrate layer 230 may be formed through a silicon deposition process. The first interconnect layer 220 may include the first dielectric layer 221.

Figure 6E:
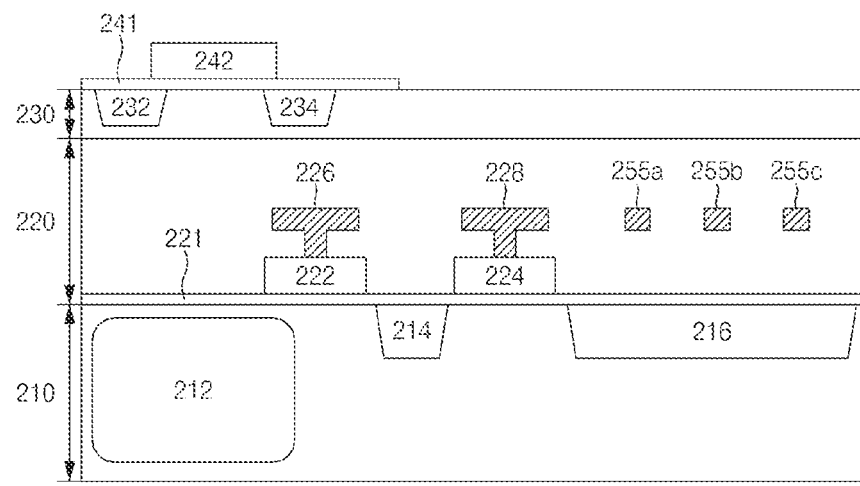

As can be seen from the cross-sectional view of FIG. 6E, the first terminal region 232 of the drive transistor and the second terminal region 234 of the drive transistor may be formed over the second substrate layer 230. The second dielectric layer 241 and the drive transistor gate 242 may be formed over the second substrate layer 230.

In some implementations, the first terminal region 232 of the drive transistor and the second terminal region 234 of the drive transistor may be doped with impurities complementary to those of the second substrate layer 230. For example, when the second substrate layer 230 is doped with P-type impurities, the first terminal region 232 of the drive transistor and the second terminal region 234 of the drive transistor may be doped with N-type impurities.

The second dielectric layer 241 may be formed in a region where the drive transistor gate 242 is disposed. The second dielectric layer 241 may include silicon oxide. The drive transistor gate 242 may include polysilicon.

Figure 6F:
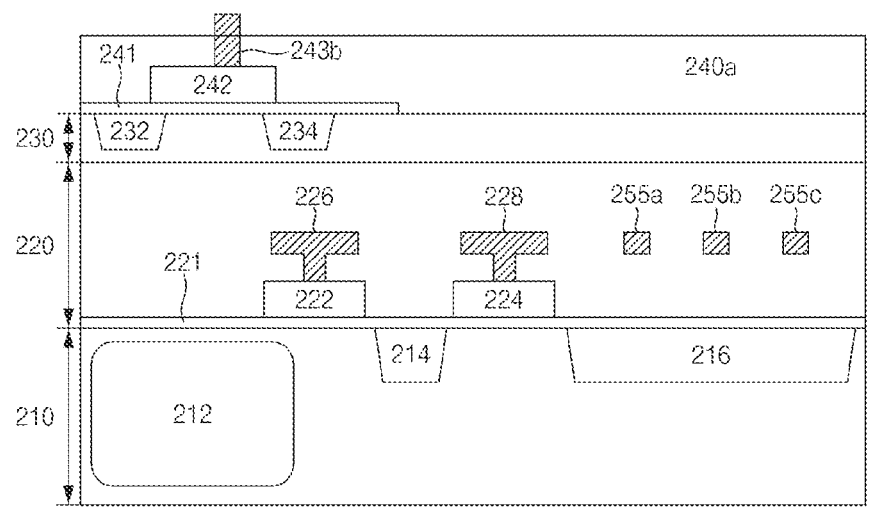

As can be seen from the cross-sectional view of FIG. 6F, one portion 240a of the second interconnect layer and a through interconnect pattern (also called a through wiring pattern) 243b may be formed over the second substrate layer 230.

One portion 240a of the second interconnect layer may include a low-permittivity material such as silicon oxide. The through interconnect pattern 243b may indicate the position for a through interconnect (or a through wiring) to be formed.

Figure 6G:
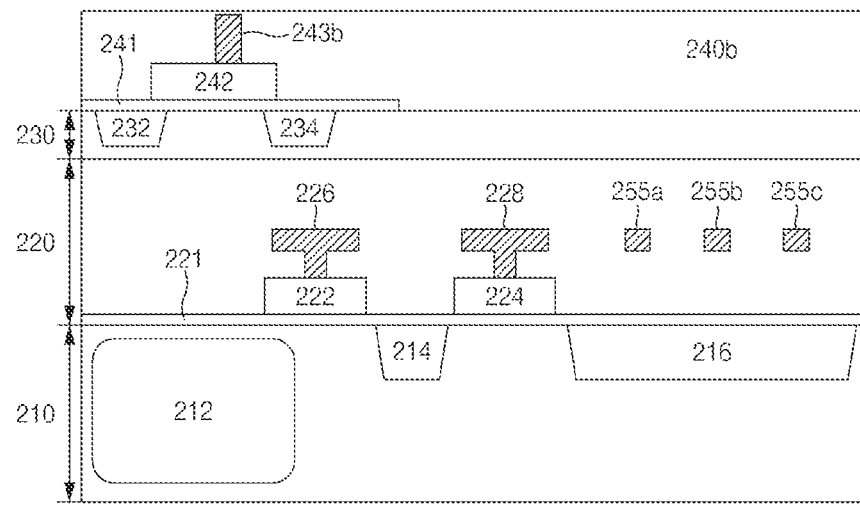

As can be seen from the cross-sectional view of FIG. 6G, one portion 240b of the second interconnect layer may be stacked to overlap the through interconnect pattern 243b. The lengths of the second TSVs 256a, 256b, and 256c to be formed in a subsequent process may be determined differently depending on a thickness of the portion 240b of the second interconnect layer.

Figure 6H:
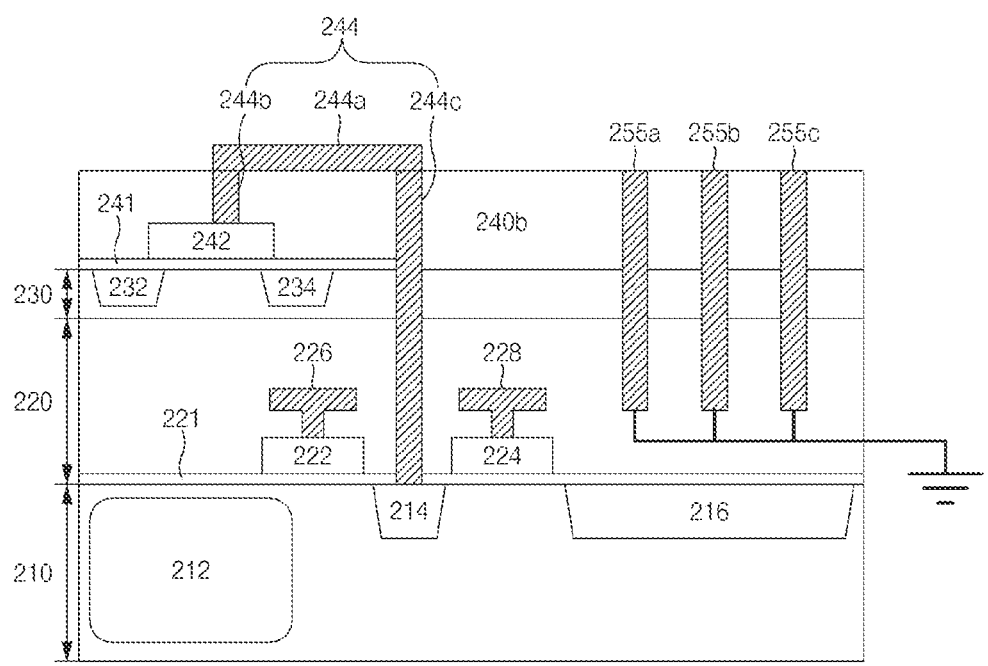

As can be seen from the cross-sectional view of FIG. 6H, the through interconnect 244 and the second TSVs 256a, 256b, and 256c may be formed.

The through interconnect 244 may include the first through portion 244b, the second through portion 244c, and the connection portion 244a for connecting the first through portion 244b to the second through portion 244c.

The first through portion 244b, the second through portion 244c, and the second TSVs 256a, 256b, and 256c may be formed by etching the interconnect layer and the substrate layers (e.g., 220, 230, and 240b) and then stacking a metal material over the etched region. In some implementations, the through interconnect 244 and the second TSVs 256a, 256b, and 256c may be formed of or include copper (Cu) or tungsten (W) or a combination of copper (Cu) and tungsten (W).

The second TSVs 256a, 256b, and 256c may be formed at positions corresponding to the second TSV patterns 255a, 255b, and 255c.

The ground contact portion 252 may be coupled to the second TSVs 256a, 256b, and 256c, and may be formed to receive the ground voltage (GND). In some implementations, after formation of the second TSVs 256a, 256b, and 256c, the ground contact portion 252 may be formed through an interconnect structure connected to the second TSVs 256a, 256b, and 256c. The second electrode of the capacitor 250 may be grounded by the ground contact portion 252.

In some other implementations, the ground contact portion may be formed simultaneously with formation of the second TSV patterns 255a, 255b, and 255c.

Figure 6I:
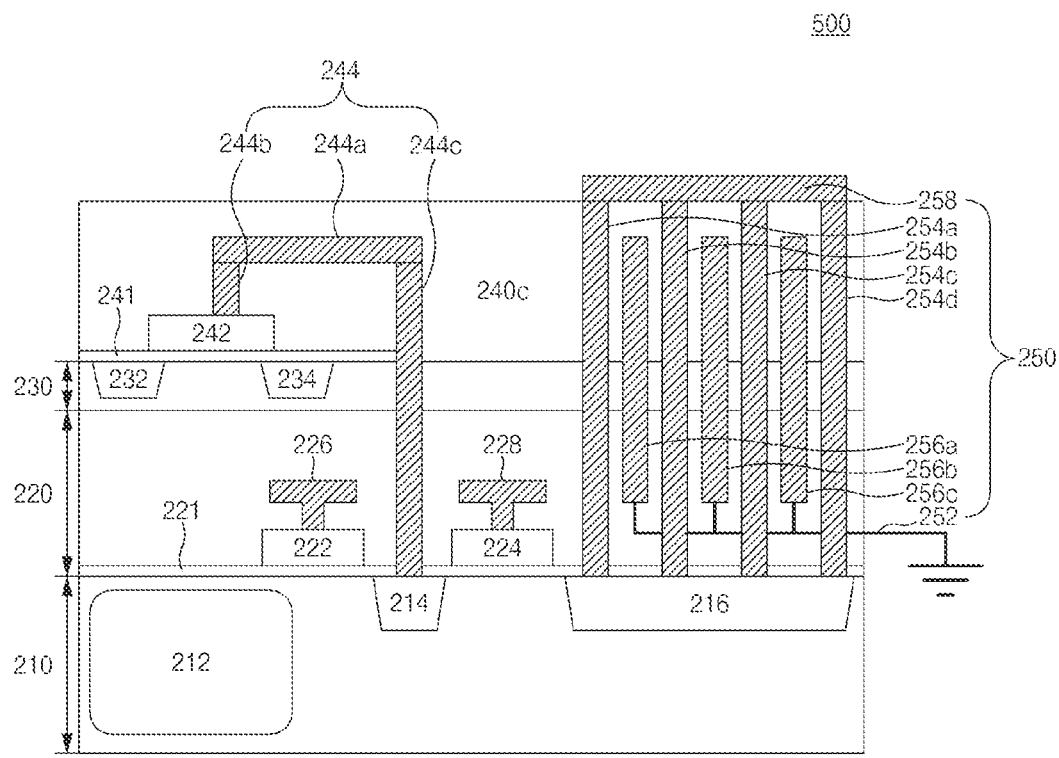

As can be seen from the cross-sectional view of FIG. 6I, the capacitor 250 may be formed across the first interconnect layer 220, the second substrate layer 230, and one portion 240c of the second interconnect layer.

The lengths of the first TSVs 254a, 254b, 254c, and 254d to be formed in a subsequent process may be determined differently depending on a thickness of the portion 240c of the second interconnect layer.

The first TSVs 254a, 254b, 254c, and 254d may be formed by etching the substrate layers (e.g., 221, 220, 230, 240c) and then stacking a metal material over the etched region. As the first dielectric layer 221 is etched, the first TSVs 254a, 254b, 254c, and 254d may be directly coupled to the contact region 216.

In some implementations, the insulation layer may be formed among the etched dielectric layer, the etched interconnect layer, the etched substrate layers (e.g., 221, 220, 230, 240c), and the first TSVs (254a, 254b, 254c, 254d).

The first TSVs 254a, 254b, 254c, and 254d may be interconnected by the connection electrode 258. The first electrode of the capacitor 250 may include the connection electrode 258 and the first TSVs 254a, 254b, 254c, and 254d.

Figure 6J:
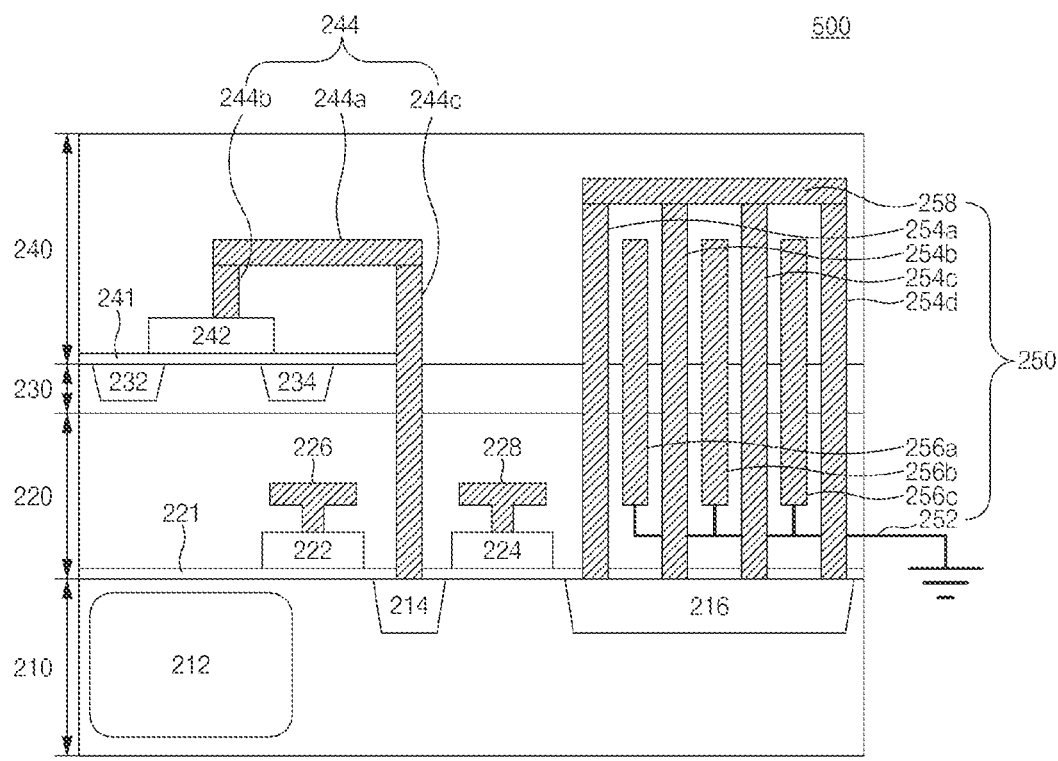

FIG. 6J is a cross-sectional view illustrating an example of the unit pixel. Referring to FIG. 6J, the second interconnect layer 240 may be stacked over the capacitor 250, resulting in formation of the unit pixel.

As is apparent from the above description, the image sensing device based on some implementations of the disclosed technology can guarantee a high dynamic range (HDR) while being miniaturized.

The embodiments of the disclosed technology may provide a variety of effects capable of being directly or indirectly recognized through the above-mentioned patent document.

Those skilled in the art will appreciate that the disclosed technology may be carried out in other specific ways than those set forth herein. In addition, claims that are not explicitly presented in the appended claims may be presented in combination as an embodiment or included as a new claim by a subsequent amendment after the application is filed.

Although a number of illustrative embodiments have been described, it should be understood that modifications and/or enhancements to the disclosed embodiments and other embodiments can be devised based on what is described and/or illustrated in this patent document.

What is claimed is:

1. An image sensing device comprising:
  a first substrate layer including a photoelectric conversion region for converting incident light into photocharges, and a floating diffusion region for storing the photocharges therein;
  a first interconnect layer disposed over the first substrate layer, and including a switch transistor gate overlapping at least a portion of the floating diffusion region;
  a second substrate layer disposed over the first interconnect layer;
  a second interconnect layer disposed over the second substrate layer; and
  a capacitor electrically coupled to the floating diffusion region by the switch transistor gate,
  wherein
    the capacitor includes a first electrode and a second electrode that are disposed across the first interconnect layer, the second substrate layer, and the second interconnect layer,
    wherein a portion of the first interconnect layer, a portion of the second substrate layer, and a portion of the second interconnect layer are disposed between the first electrode and the second electrode,
    wherein the second substrate layer includes a first terminal region of a drive transistor and a second terminal region of the drive transistor, and
    wherein the second substrate layer includes a silicon-on-insulator (SOI) substrate,
    wherein the first electrode includes a plurality of first through silicon vias (TSVs) disposed across the first interconnect layer, the second substrate layer, and the second interconnect layer; and a connection electrode disposed in the second interconnect layer, and configured to interconnect the first through silicon vias (TSVs), and wherein the first substrate layer includes a contact region overlapping at least a portion of the switch transistor gate, and wherein the first through silicon vias (TSVs) are in contact with the contact region, and wherein the contact region is included in the first electrode of the capacitor and the contact region is doped with higher-concentration impurities than the floating diffusion region.

2. The image sensing device according to claim 1, wherein the second electrode includes:

a plurality of second through silicon vias (TSVs) disposed across the first interconnect layer, the second substrate layer, and the second interconnect layer; and a ground contact portion disposed in the first interconnect layer, and formed to interconnect the second through silicon vias (TSVs).

3. The image sensing device according to claim 2, wherein:

the ground contact portion is coupled to a ground voltage.

4. The image sensing device according to claim 1, wherein:

the connection electrode is disposed perpendicular to the first through silicon vias (TSVs).

5. The image sensing device according to claim 1, wherein:

the second interconnect layer includes a drive transistor gate overlapping at least a portion of the photoelectric conversion region; and the floating diffusion region is coupled to a gate of the drive transistor by a through interconnect structure, wherein the through interconnect structure is disposed across the second interconnect layer, the second substrate layer, and the first interconnect layer.

6. The image sensing device according to claim 5, wherein:

each of the through interconnect structure, the first electrode, and the second electrode includes at least one of copper (Cu) and tungsten (W).

7. The image sensing device according to claim 1, wherein the first interconnect layer further includes a transfer transistor gate overlapping the photoelectric conversion region along a first side of the transfer transistor gate.

8. The image sensing device according to claim 7, wherein the transfer transistor gate overlaps the floating diffusion region along a second side of the transfer transistor gate.

9. The image sensing device according to claim 8, wherein a length of the first side is longer than a length of the second side.

10. An image sensing device comprising:

a first substrate layer including a photoelectric conversion region for converting incident light into photocharges, and a floating diffusion region for storing the photocharges therein;

a first interconnect layer disposed over the first substrate layer and including a transfer transistor gate overlapping at least a portion of the photoelectric conversion region and a switch transistor gate overlapping at least a portion of the floating diffusion region;

a second substrate layer disposed over the first interconnect layer and including a first terminal region of a drive transistor and a second terminal region of the drive transistor, the second substrate layer includes a silicon-on-insulator (SOI) substrate;

a second interconnect layer disposed over the second substrate layer and including a gate of the drive transistor that is coupled to the floating diffusion region by a through interconnect structure; and a capacitor disposed across the first interconnect layer, the second substrate layer, and the second interconnect layer, wherein the capacitor is electrically coupled to the floating diffusion region by the switch transistor gate, wherein the capacitor includes a first electrode and a second electrode that are disposed across the first interconnect layer, the SOI substrate, and the second interconnect layer, wherein a portion of the first interconnect layer, a portion of the SOI substrate, and a portion of the second interconnect layer are disposed between the first electrode and the second electrode, and wherein the first electrode includes a first through silicon vias (TSVs) disposed across the first interconnect layer, the SOI substrate, and the second interconnect layer; and a connection electrode disposed in the second interconnect layer, and configured to interconnect the first through silicon vias (TSVs), and wherein the first substrate layer includes a contact region overlapping at least a portion of the switch transistor gate, and wherein the first through silicon vias (TSVs) are in contact with the contact region, and wherein the contact region is included in the first electrode of the capacitor and the contact region is doped with higher-concentration impurities than the floating diffusion region.

11. The image sensing device according to claim 10, wherein the second electrode includes:

a second through silicon via (TSV) disposed across the first interconnect layer, the second substrate layer, and the second interconnect layer, and a ground contact portion disposed in the first interconnect layer.

12. The image sensing device according to claim 11, wherein the capacitor further includes:

a dielectric region disposed between the first electrode and the second electrode, wherein the dielectric region includes a portion of the first interconnect layer, a portion of the second substrate layer, and a portion of the second interconnect layer.

13. The image sensing device according to claim 11, wherein:

the ground contact portion is coupled to a ground voltage.

14. The image sensing device according to claim 11, wherein:

the first electrode is electrically coupled to the floating diffusion region by the switch transistor gate.

15. The image sensing device according to claim 11, wherein the transfer transistor gate overlaps the floating diffusion region such that a length of a side of the transfer transistor gate overlapping with the photoelectric conversion region is longer than a length of another side of the transfer transistor gate overlapping with the floating diffusion region.

* * * * *